US006757171B2

United States Patent
Bauer et al.

(10) Patent No.: US 6,757,171 B2
(45) Date of Patent: Jun. 29, 2004

(54) DEVICE FOR FIXING A HEAT DISTRIBUTION COVERING ON A PRINTED CIRCUIT BOARD WITH HEAT DISTRIBUTION COVERING

(75) Inventors: Monika Bauer, Taufkirchen (DE); Jens Pohl, Bernhardswald (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/271,097

(22) Filed: Oct. 11, 2002

(65) Prior Publication Data

US 2003/0067754 A1 Apr. 10, 2003

Related U.S. Application Data

(63) Continuation of application No. PCT/DE01/01400, filed on Apr. 10, 2001.

(30) Foreign Application Priority Data

Apr. 11, 2000 (DE) .......................................... 100 17 925

(51) Int. Cl.[7] .................................................. H05K 7/20
(52) U.S. Cl. ...................................... 361/719; 361/705
(58) Field of Search .......................... 29/832, 840, 854; 228/179, 180.1, 180.2; 174/252; 165/80.3, 185; 257/704–706, 713, 718, 719, 726, 727; 361/704, 705, 717–719, 720, 752, 760

(56) References Cited

U.S. PATENT DOCUMENTS

| 4,625,260 A | | 11/1986 | Jordan et al. |
| 5,396,404 A | * | 3/1995 | Murphy et al. ............. 361/719 |
| 5,541,811 A | | 7/1996 | Henningsson et al. |
| 5,621,615 A | * | 4/1997 | Dawson et al. ............. 361/704 |
| 5,834,335 A | * | 11/1998 | Buschbom ................... 438/107 |
| 5,838,064 A | * | 11/1998 | Shimada et al. ............ 257/718 |
| 5,973,399 A | * | 10/1999 | Stark et al. ................. 257/731 |
| 6,445,568 B1 | * | 9/2002 | Baur et al. .................. 361/600 |
| 6,483,702 B1 | * | 11/2002 | Lofland ...................... 361/704 |

FOREIGN PATENT DOCUMENTS

| DE | 35 33 128 A1 | 4/1986 |
| DE | 196 00 619 A1 | 7/1997 |
| DE | 197 06 790 A1 | 8/1998 |
| DE | 197 23 409 A1 | 12/1998 |
| JP | 06112676 A | 4/1994 |
| JP | 09177320 A | 6/1994 |

* cited by examiner

*Primary Examiner*—Anatoly Vortman
(74) *Attorney, Agent, or Firm*—Laurence A. Greenberg; Werner H. Stemer; Gregory L. Mayback

(57) ABSTRACT

A device for fixing a heat distribution covering on a printed circuit board includes at least one fixing foot disposed on a placement area next to a plurality of heat-generating electronic components. The fixing foot is attached above a further conductor track plane that extends below a conductor track plane that interconnects the electronic components. The fixing foot carries a fixing element that can be brought into engagement with the heat distribution covering.

46 Claims, 4 Drawing Sheets

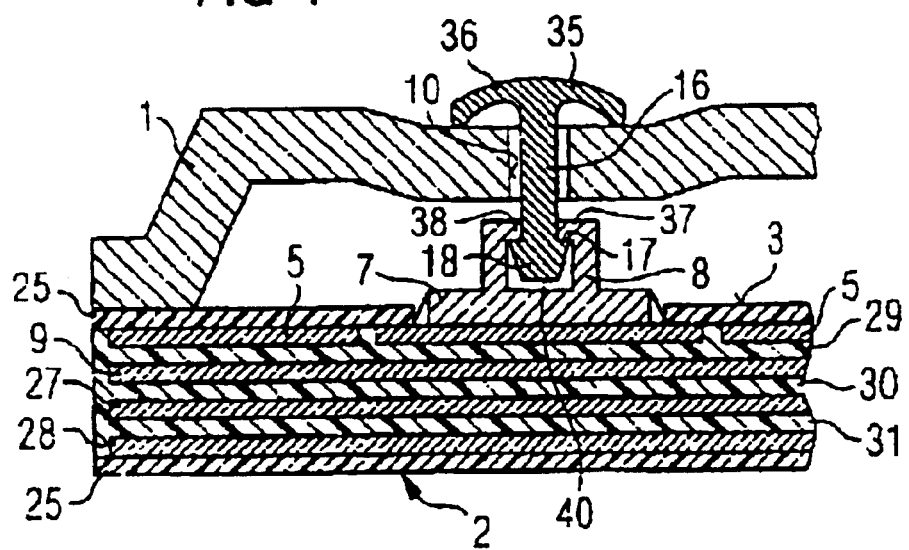
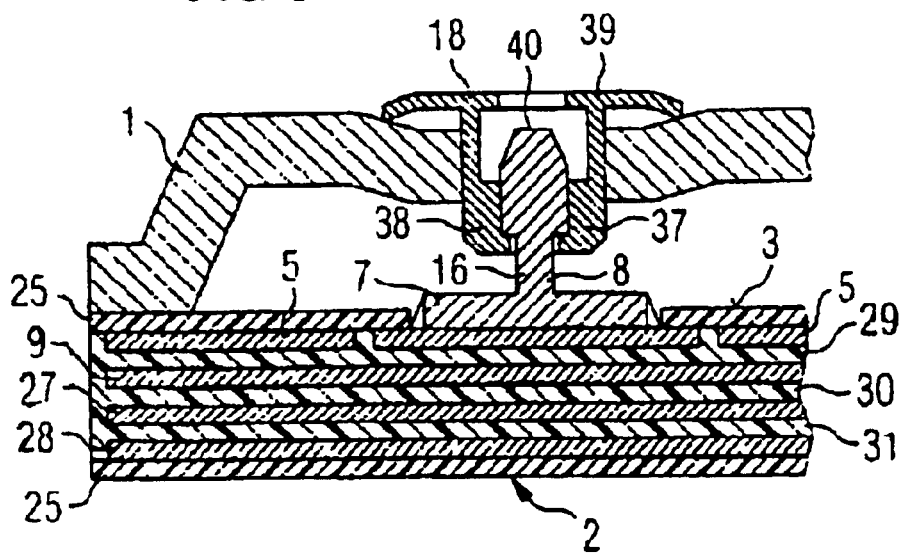

DEVICE FOR FIXING A HEAT DISTRIBUTION COVERING ON A PRINTED CIRCUIT BOARD WITH HEAT DISTRIBUTION COVERING

CROSS-REFERENCE TO RELATED APPLICATION

This application is a continuation of copending International Application No. PCT/DE01/01400, filed Apr. 10, 2001, which designated the United States and which was not published in English.

BACKGROUND OF THE INVENTION

1. Field of the Invention

The invention relates to a device for fixing a heat distribution covering on a printed circuit board having a plurality of heat-generating electronic components arranged on a placement area of the printed circuit board.

Heat distribution coverings of this type serve to take up the heat from the heat-generating electronic components and to distribute the heat energy over a relatively large cooling area. However, the fixing of a heat distribution covering of this type constitutes a problem since corresponding fixing elements on the one hand occupy part of the placement area and on the other hand impair the strength of the printed circuit board. Furthermore, the area losses arising as a result of each fixing element multiply, in the case of a multilayer printed circuit board, with the number of conduction planes provided.

SUMMARY OF THE INVENTION

It is accordingly an object of the invention to provide an improved device for fixing a heat distribution covering, which overcomes the above-mentioned disadvantages of the heretofore-known devices and methods of this general type and further a circuit board provided with a heat distribution covering that is attached with the improved device.

With the foregoing and other objects in view there is provided, in accordance with the invention, a device for fixing a heat distribution covering on a printed circuit board. The printed circuit board (PCB) has a placement area carrying a plurality of heat-generating electronic components and at least one conductor track plane for connecting to contact terminals of the components. The fixing device comprises:

a fixing foot attached on the placement area above at least one further conductor track plane extending below the fixing foot; and a fixing element disposed on the fixing foot and configured to engage and hold the heat distribution covering on the printed circuit board.

Specifically, the fixing foot is disposed to be aligned opposite an opening formed in the heat distribution covering.

In other words, the invention provides for a device for fixing a heat distribution covering on a printed circuit board with a plurality of heat-generating electronic components arranged on a placement area of the printed circuit board and has at least one conductor track plane for interconnecting contact connections of the components.

In a region on the placement area which has at least one fixing foot, the fixing foot bears a placement element. The placement element can be brought into engagement with the heat distribution covering and at least one further conductor track plane is arranged below the region of the fixing foot.

This type of fixing has the advantage that it is only for the at least one fixing foot on the placement area of the printed circuit board that a corresponding metallic layer, of which the conductor tracks are also composed, has to be uncovered in order to arrange and fix the fixing foot on this metallic area. There is no need to fit further mechanical clamping or fixing devices through the printed circuit board itself, so that, in particular, in the case of multilayer printed circuit boards, conductor track planes lying below the region which is occupied by the fixing foot are available with no loss of area for the conductor track routing. Consequently, the device according to the invention provides the possibility of exhausting the full volume of the printed circuit board for the conductor track connections and limits the area requirement on the printed circuit board only to the fixing area required for at least one fixing foot on the topmost conductor track plane of the printed circuit board.

In accordance with an added feature of the invention, the device has a soldered connection between the fixing foot and the placement area, the soldered connection having the advantage that it can be combined temporarily with soldering connecting steps for fitting the electronic components, thereby obviating additional processing steps.

In accordance with an additional feature of the invention, the device has a friction welding connection between the fixing foot and the placement area. The friction welding connection has the advantage that it is only locally in the region of the fixing foot that the printed circuit board is heated during the production of the connection and the induction of thermoelectric voltage in the printed circuit board is reduced compared with a soldered connection.

Furthermore, the device may have an adhesive bonding between the fixing foot and the placement area. Since an adhesive bonding connection can be realized without a temperature increase in this case, a thermally nonstressed connection results, which is advantageous in many applications.

In accordance with another feature of the invention, the heat distribution covering has an opening arranged opposite the fixing foot. This embodiment is associated with the advantage that fixing elements can be inserted through the opening arranged opposite the fixing foot and can thus bring the heat distribution covering into engagement with the fixing foot.

To that end, in one embodiment of the invention, the fixing element may be a threaded pin applied orthogonally to the placement area on the fixing foot. A fitting nut can be screwed onto a thread pin of this type, the nut being arranged with an accurate fit in the opening in the heat distribution covering, so that the heat distribution covering is in engagement with the fixing foot via the threaded pin with the aid of the fitting nut reaching through the opening. This results in a releasable fixedly anchored fitting of the heat distribution covering on the printed circuit board.

In a further embodiment of the invention, heat-generating components on the printed circuit board whose structural height is smaller than the distance between heat distribution covering and printed circuit board are thermally conductively connected to the heat distribution covering by means of a heat-conducting filling material which is arranged between the individual electronic component and the heat distribution covering. This embodiment of the invention has the advantage that a wide variety of heat-generating components with varying structural height can be cooled by the heat distribution covering by means of the heat-conducting filling material.

Instead of a threaded pin applied orthogonally to the placement area on the fixing foot, it is also possible to arrange a fixing element with an internal thread, such as a fixing nut, on the fixing foot. In this case, the heat distribution covering is screwed to the internal thread of the fixing element with the aid of a covering screw which projects through the opening in the heat distribution covering. Both a fixing nut and a threaded pin may be formed in one piece with the fixing foot, thereby reducing the number of components to be stored for the fixing according to the invention.

In a further embodiment of the invention, the fixing element is a plug pin with an attachment via which a plug element arranged with an accurate fit in the opening in the heat distribution covering is in engagement. A plug element of this type may have, in the region of the attachment of the plug pin, snap-action hooks which slide over the attachment and spread apart and then latch into place behind the attachment, so that the heat distribution covering is fixedly connected to the fixing foot and thus to the printed circuit board via the plug element and the plug pin. The plug pin and the fixing foot may be formed in one piece, which again affords the advantage that the number of fixing elements to be stored is reduced.

In a further embodiment of the invention, the fixing element is a cylindrical wherein is arranged orthogonally to the placement area of the printed circuit board on the fixing foot or is formed in one piece with the fixing foot. A cylindrical pin of this type as fixing element may project through the opening in the heat distribution covering and the heat distribution covering may be fixed at the cylindrical pin by means of a crown disk. The radially inner cutting areas of the crown disk are anchored in the material of the cylindrical pin in this case.

Furthermore, the opening itself may have the form and the cutting areas of a crown disk, so that the heat-distributing covering can be placed directly onto the cylindrical fixing pin and anchors itself through the correspondingly formed openings at the cylindrical pin. This embodiment has the advantage that, apart from a fixing pin with fixing foot, no further fixing elements are necessary for anchoring the heat distribution covering on the printed circuit board. Forming the openings with cutting areas similar to a castle nut can be achieved by stamping pressing in one work operation with a suitably designed stamping tool.

In a further embodiment of the invention, the fixing element may be a rivet-type wherein, after the application of the heat distribution covering, is reshaped to form a rivet head at its free end projecting through the opening in the heat distribution covering. However, the pin may also be designed as a hollow rivet, so that only the edge of the hollow rivet which protrudes through the opening in the heat distribution covering is to be flanged.

In a further embodiment of the invention, the printed circuit board may have a soldering resist layer on both surfaces and the heat-generating electronic components may be arranged on the placement area on the printed circuit board using CSP technology (CSP, chip scale package), LFBGA technology (LFBGA, low-profile fine-pitch ball-grid array) or using flip-chip technology. Processes in flip-chip technology, in particular, requires a multilayer printed circuit board in order to be able to interconnect the multiplicity of contact areas of the individual heat-generating electronic components.

In particular, the invention thus relates to the fixing of heat spreaders (or heat distribution coverings) on memory modules in such a way that as little space as possible on the printed circuit board (PCB) has to be used for the fixing. A problem in the case of high-density memory modules is the space requirement of the memory and peripheral components and also the electrical connection thereof by routing of the conductor tracks on the PCB. The difficulty is that the fixing points for the heat spreader cannot be chosen freely, but rather must be present in a defined arrangement and number in order to achieve a sufficiently good fixing and a good contact of the gap filler (or heat-conducting filling material which conducts the heat from the components (or electronic components) into the heat spreader and is intended to compensate for mechanically small height differences between the components).

Fixing with hollow rivets requires bored holes in the PCB. It is not possible to route the conductor tracks in the region of the holes and a certain safety zone (keep out zone), as a result of which, in the case of high-density memory modules, it may become impossible to connect the components by means of conductor tracks. The "keep out zone" may additionally be enlarged by the fact that the heat spreader (HS) is embossed, as a result of which it is necessary additionally to comply with a safety clearance between the components and the embossing zone.

According to the invention, a fixing element is mounted on the PCB. This element performs the fixing of the heat spreader on the PCB. In one embodiment of the invention, the fixing element is placed together with the components on the PCB, i.e. ideally fixing elements with "SMD capability" are involved which are emplaced by the placement machine and fixed during soldering (SMD, surface-mounted device).

The fixing of the element is done by soldering by means of SMD soldering paste, since it is thus not necessary to use any further materials. As an alternative, other connections between placement areas of the printed circuit board and fixing foot of a fixing element, such as an adhesive connection, a laser welding connection or a friction welding connection are also suitable for particular embodiments.

For soldering, the size of the land pad, the geometry of the fixing foot of the fixing element and also the geometry of the soldering resist mask (solder mask) are coordinated with one another in such a way that the fixing element as far as possible has a self-centering action during soldering, so that it is drawn into the desired position by the surface tensions acting during soldering. Furthermore, the geometry of the fixing element with fixing foot is set in such a way that, in principle, SMD placement is possible, hereby ensuring processability on automatic placement machines, with the element securely situated on the PCB without "falling over" during the processing.

With the above and other objects in view there is also provided, in accordance with the invention, a printed circuit board assembly, comprising:

a printed circuit board having a placement area carrying a plurality of heat-generating electronic components having respective connection terminals;

at least one conductor track plane for interconnecting said connection terminals of said electronic components;

a device for fixing a heat distribution covering on said printed circuit board, said device including:

a fixing foot attached on said placement area above at least one further conductor track plane extending below said fixing foot; and a fixing element disposed on said fixing foot and configured to engage and hold the heat distribution covering on the printed circuit board.

With the above and other objects in view there is also provided, in accordance with the invention, a printed circuit board assembly, comprising:

a printed circuit board having a placement area carrying a plurality of heat-generating electronic components having respective connection terminals;

a first conductor track plane interconnecting said connection terminals of said electronic components, and a second conductor track plane below said first conductor track plane;

a heat distribution covering disposed to cover said electronic components; and a device for fixing said heat distribution covering on said printed circuit board, said device including a fixing foot attached on said placement area above said second conductor track plane; and a fixing element disposed on said fixing foot and engaging and holding said heat distribution covering on said printed circuit board.

The invention thus has a plurality of advantages, which include, by way of example:

On the PCB, only the topmost conductor track plane is used for the fixing element; the central layers can still be used for the routing of conductor tracks. In other words, the invention affords a high degree of flexibility for the PCB design.

At the same time, deep embossing of the heat spreader in the region of the fixing element becomes superfluous or the heat spreader can be made flatter since embossing only becomes necessary if very narrow thickness restrictions apply to the memory module, if e.g. a rivet head is to be countersunk in an embosser. As a result, the components can also be positioned nearer to the fixing element.

The invention can be used both for single-sided and for double-sided HS mounting.

Other features which are considered as characteristic for the invention are set forth in the appended claims.

Although the invention is illustrated and described herein as embodied in a device for fixing a heat distribution covering on a printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a partial section through a device for fixing a heat distribution covering on a printed circuit board with a plug element having snap-action hooks on a fixing foot in accordance with a fourth embodiment of the invention;

FIG. 5 is a partial section through a device for fixing a heat distribution covering on a printed circuit board with a plug pin having an attachment in accordance with a fifth embodiment of the invention;

DESCRIPTION OF THE PREFERRED EMBODIMENTS

Figure 1:
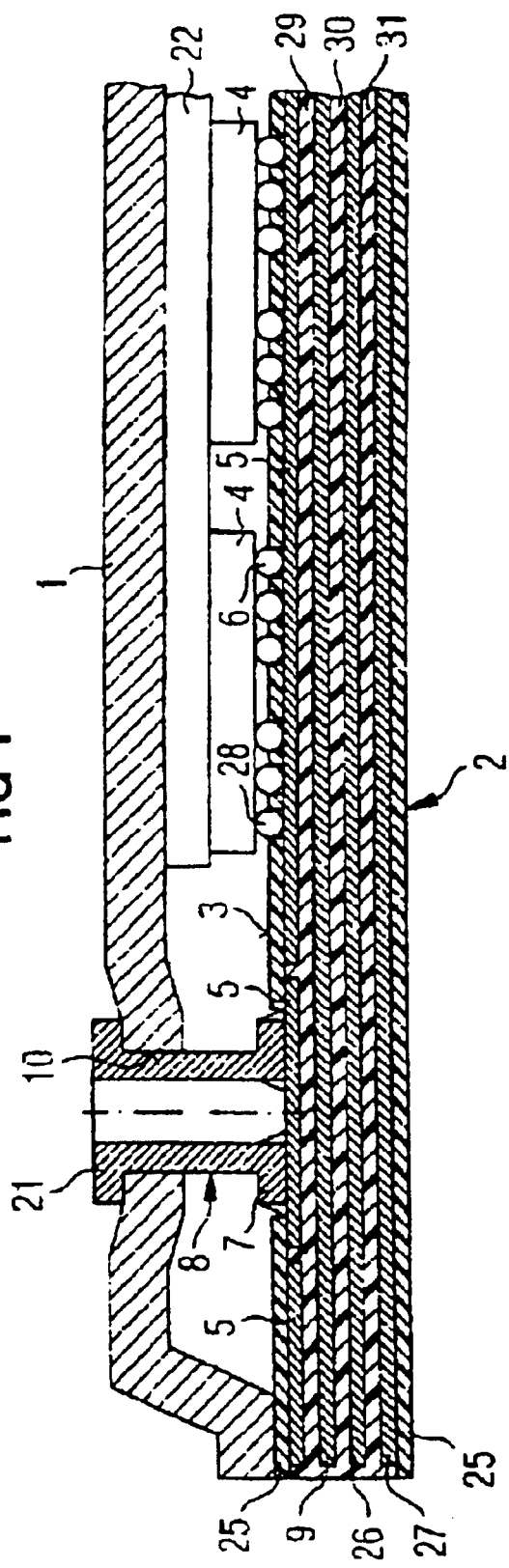
FIG. 1 is a partial section through a device for fixing a heat distribution covering on a printed circuit board with a hollow-rivet-type fixing element in accordance with a first embodiment of the invention.

Referring now to the figures of the drawing in detail and first, particularly, to FIG. 1 thereof, there is shown a cross section through a device for fixing a heat distribution covering 1 on a printed circuit board 2 with a hollow-rivet-type fixing element 8. In this embodiment, the heat distribution covering 1 is made of an aluminum alloy and is in thermally conductive contact with the heat-generating components 4 by means of a heat-conducting filling material 22, so that the heat generated in the components 4 is conducted via the heat-conducting filling material 22 to the heat-distributing covering and is radiated into the surroundings from the outer surface of the heat distribution covering 1. A heat distribution covering 1 of this type can be used on the one hand to uniformly distribute the varying evolution of heat in the individual heat-generating electronic components 4 and to achieve effective cooling. To that end, the heat distribution covering 1 is pressed with prestress on the circuit board by means of a fixing element 8. In this embodiment, the fixing element 8 is a hollow rivet whose foot is soldered onto a conductor track area which has previously been freed of the covering and insulating soldering resist layer 25. Below the region of the fixing foot 7, the conductor track layers 9, 26 and 27 can constitute conductive connections without disturbance and without limitation. For this type of fixing, all that is required from the placement surface is the region wherein the fixing foot 7 is to be soldered onto the metallic area of the placement area 3 of the printed circuit board 2.

As is furthermore shown in FIG. 1, the heat-generating active components 4 are arranged by means of LFBGA technology in this exemplary embodiment, so that soldering contact bumps 28 produce the connection to the various conductor track levels 5, 9, 26 and 27 via non-illustrated through contacts in the printed circuit board.

In order to achieve a fixing of the heat distribution covering 1 on the printed circuit board 2, in this embodiment firstly the hollow-cylindrical rivets 21 are soldered by their foot regions onto an area of the conductor track plane 5 that has correspondingly been freed of a soldering resist layer 25. The hollow-cylindrical hollow rivets 21 then project above the height level of the heat-generating components 4 and can be arranged with an accurate fit in the openings 10 in the heat distribution covering 1. After the heat distribution covering 1 has been pushed over the fixed hollow rivets 21 with its openings 10, the ends of the hollow rivets which project above the heat distribution covering 1 can be flanged in their edge regions and it is thus possible to achieve a stable arrangement and fixing of the heat distribution covering 1 on the printed circuit board 2.

Figure 2:
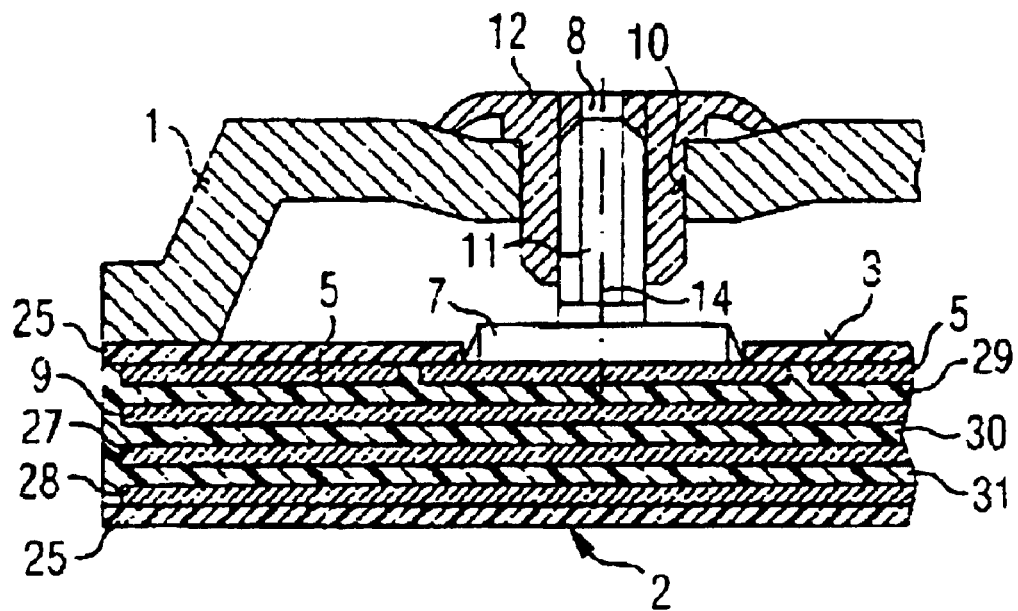
FIG. 2 is a partial section through a device for fixing a heat distribution covering on a printed circuit board with a threaded pin as fixing element in accordance with a second embodiment of the invention.

FIG. 2 shows a cross section through a device for fixing a heat distribution covering 1 on a printed circuit board 2 with a threaded pin 11 as fixing element 8 in accordance with a second embodiment of the invention. In this embodiment the fixing foot 7 forms an integral element with the threaded pin 11. The threaded pin 11 projects through the opening 10 in the heat distribution covering 1. The heat covering 1 is supported on the printed circuit board 2, which, for its part, is constructed from an upper and a lower soldering resist layer, a plurality of insulating layers 29, 30, 31 and conductor track layers 5, 9, 26 and 27. A fitting nut 12 is arranged with an accurate fit in the opening 10 in the heat distribution covering 1, so that the heat distribution covering 1 is connected to the placement area 3 of the multilayer printed circuit board 2 via the fitting nut 12, the threaded pin 11 and the fixing foot 7. FIG. 2 shows that the region below the fixing foot 7 is completely available to the conductor track layers 9, 27 and 28 for conductor track routing.

During the assembly of printed circuit board 2 and heat distribution covering 1, in this embodiment firstly the soldering resist layer 25 is removed at the regions provided on the placement surface, the fixing foot 7 with threaded pin 11 provided in one piece is soldered on and, finally, the heat distribution covering 1 is placed onto the printed circuit board 2, the threaded pins projecting through the openings 10 in the heat distribution covering 1. Afterward, a fitting nut 12 is screwed onto the threaded pin 11 and arranged with an accurate fit in the opening 10 in the heat distribution covering 1. This second embodiment of the invention has the advantage over the first embodiment of the invention that the heat distribution covering 1 is fixed in a releasable manner on the printed circuit board 2, so that the heat distribution covering 1 can be removed by unscrewing for repair and maintenance purposes.

Figure 3:
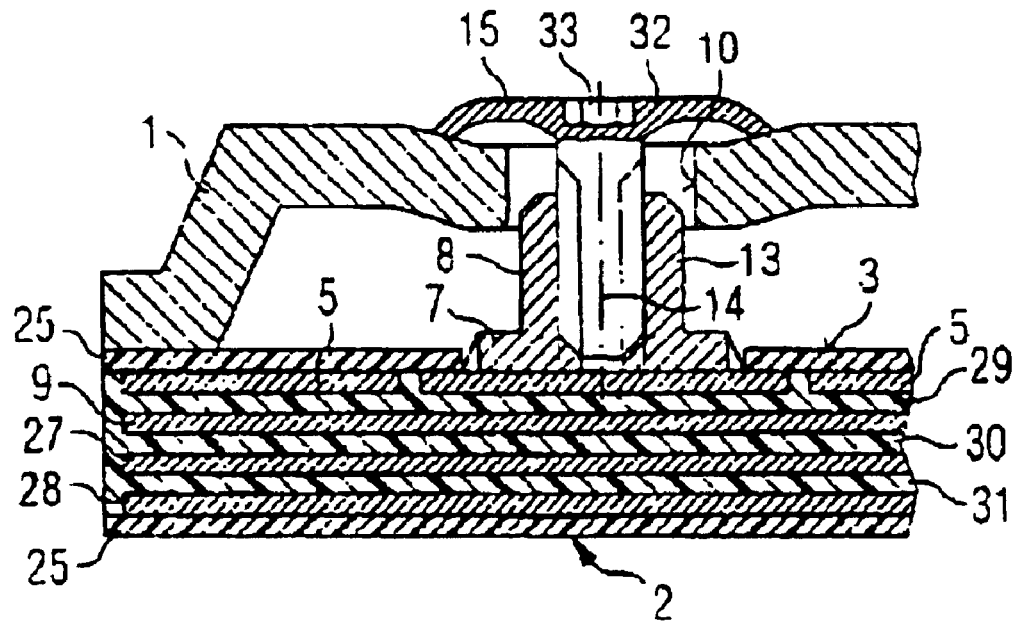
FIG. 3 is a partial section through a device for fixing a heat distribution covering on a printed circuit board with a fixing nut in accordance with a third embodiment of the invention.

FIG. 3 shows a cross section through a device for fixing a heat distribution covering 1 on a printed circuit board 2 with a fixing nut 13 as a fixing element 8 in accordance with a third embodiment of the invention. The fixing nut 13 is formed in one piece with the fixing foot 7 soldered onto the placement area 3 of the printed circuit board 2. The fixing nut 13 has an internal thread and projects with its outer periphery into the opening 10 in the heat distribution covering 1. A covering screw 15 is screwed into the fixing nut 13, the head 32 of which covering screw presses the heat distribution covering 1 onto the printed circuit board 2. As in the preceding embodiments of FIGS. 1 and 2, the printed circuit board 2 is composed of a plurality of conductor tracks 5, 9, 27 and 28 and insulating layers 29, 30, 31.

During the assembly of printed circuit board 2 and heat distribution covering 1, firstly the soldering resist layer 25 is removed in the envisaged region of the fixing foot 7, so that the fixing foot 7 with fixing nut 13 provided in one piece can be soldered onto the metal of the conductor track plane 5. Afterward, the heat distribution covering, in this example made of an aluminum alloy, is pushed over the outer area of the fixing nut 13 with its openings and the covering screw 15 is screwed into the fixing nut 13 in that, in this exemplary embodiment, a socket-type wrench is inserted into the socket-type recess 33 of the covering screw 15. This embodiment has the advantage that the heat distribution covering 1 can be pressed with defined prestress onto the printed circuit board, it being possible to set the defined prestress with the aid of a socket-type torque wrench inserted into the socket-type wrench recess.

FIG. 4 shows a cross section through a device for fixing a heat distribution covering 1 on a printed circuit board 2 with a plug element 18 having snap-action hooks 37, 38 as fixing element 8. In this embodiment, the plug element 18 and the fixing foot 7 are formed in one piece. The snap-action hooks 37, 38 of the plug element 18 can be spread resiliently in order to receive a plug 35. The plug 35 is arranged in the opening 10 in the heat distribution covering 1 and has a plug head 36 which is curved in a dome-shaped manner and presses resiliently or in a prestressed manner against the surface of the heat distribution covering 1 in the region of the opening 10. This fourth embodiment has the advantage that it can be mounted easily and can compensate for different thermal expansions of the printed circuit board 2 and the heat distribution covering 1.

In order to assemble the device in accordance with the fourth embodiment, firstly, the fixing foot 7 with the associated plug element 18 is soldered onto the uncovered metal area of the conductor track layer 5 in the envisaged region. Afterward, the heat distribution covering is placed onto the printed circuit board 2 in a pre-aligned manner with the aid of its openings 10 so that the opening 10 is arranged opposite the fixing foot 7, and the plug 35 is subsequently pressed into each plug element 18, the snap-action hooks 37 and 38 spreading apart on account of the frustoconical free end of the plug pin 16 of the plug 35 and latching into place after surmounting the attachment 17 of the plug pin 16. The pre-curved dome-shaped plug head 36 is bent in the process, so that the heat distribution covering 1 is pressed with a prestress onto the printed circuit board 2. This contact pressure simultaneously produces a good contact between the heat conduction covering 1 and the filling material 22 which is shown in FIG. 1 and compensates for the height difference between the structural height of the components 4 shown therein and the distance between heat distribution covering 1 and printed circuit board 2.

FIG. 5 shows a cross section through a device for fixing a heat distribution covering 1 on a printed circuit board 2 with a plug pin 16 having an attachment in accordance with a fifth sixth embodiment of the invention. The cylindrical pin 19 is formed in one piece with the fixing foot 7 and projects perpendicularly relative to the placement area 3 of the printed circuit board 2 through the opening 10 in the heat distribution covering 1. A crown disk 20 is anchored with its cutting edges in the material of the cylindrical pin 19. As a result, the heat distribution covering 1 is simultaneously held in position and prestressed on the printed circuit board 2. Since the rest of the construction of the sixth embodiment of the invention corresponds to the construction and the assembly of the preceding embodiments 1 to 5, a more extensive description is omitted.

Figure 6:
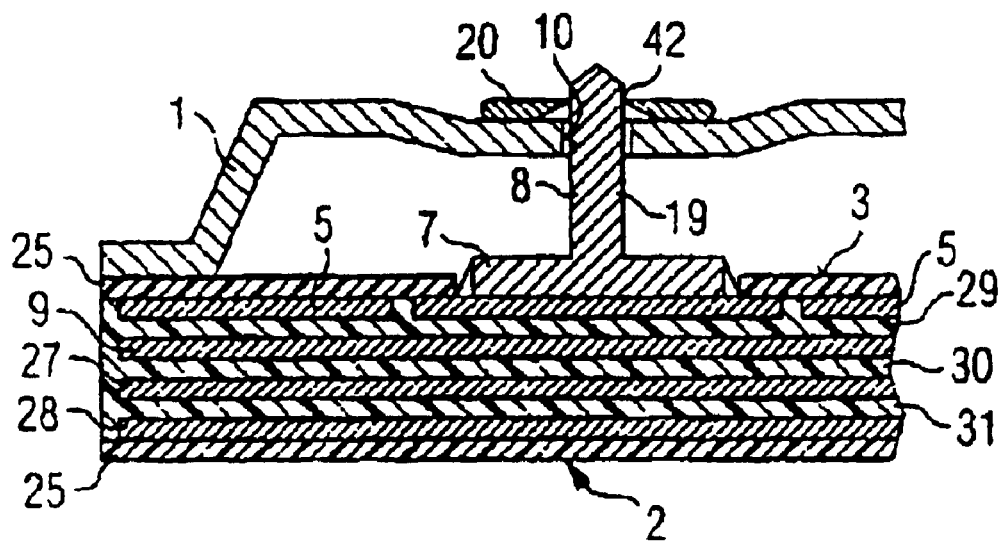
FIG. 6 is a partial section through a device for fixing a heat distribution covering on a printed circuit board with a cylindrical pin as fixing element in accordance with a sixth embodiment of the invention.
Figure 7:
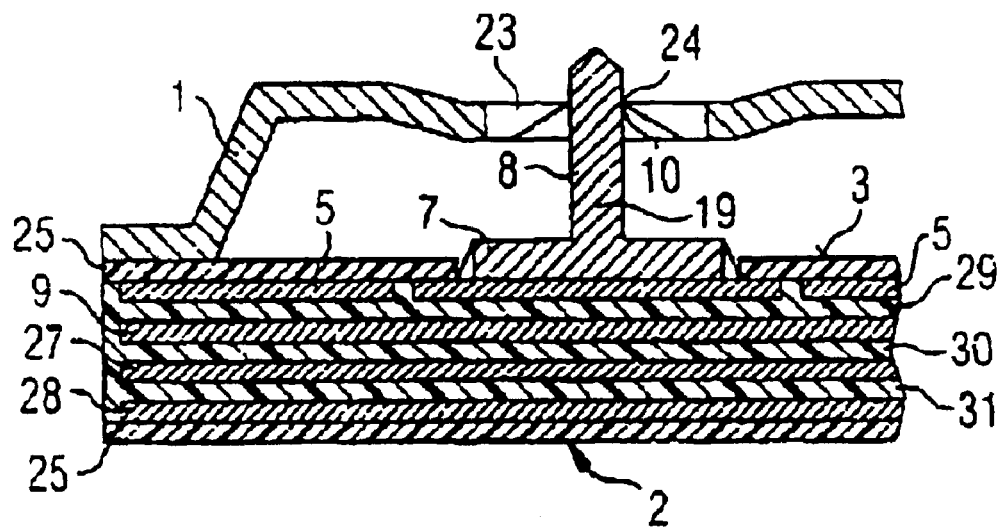
FIG. 7 is a partial section through a device for fixing a heat distribution covering on a printed circuit board with an opening shaped to form a crown disk in the heat distribution covering in accordance with a seventh embodiment of the invention.

FIG. 7 shows a cross section through a device for fixing a heat distribution covering 1 on a printed circuit board 2 with an opening 10 shaped to form a crown disk in the heat distribution covering in accordance with a seventh embodiment of the invention. In a manner similar to that in FIG. 6, a cylindrical pin 19 projects from the fixing foot 7 orthogonally to the placement area 3 of the printed circuit board 2 through an opening 10 in the heat distribution covering. This opening 10 is equipped with cutting edges 24 in the edge region, which cutting edges have been produced by stamping pressing for example, and said cutting edges 24 anchor the heat distribution covering in the region of the opening 10 in the pin material of the cylindrical pin 19. In embodiment of the invention. The plug pin 16 of the fifth embodiment is arranged as fixing element 18 on the fixing foot 7 and is formed in one piece with the latter. The free end of the plug pin 16 is of frustoconical configuration, so that a plug element 18 with resilient snap-action hooks 37, 38 can be pushed over the plug pin 16 and the attachment. The plug element 18 has a plug element head 39 which is slightly curved and is deformed resiliently whilst maintaining a prestress and is arranged with an accurate fit in the opening in the heat distribution covering 1. This embodiment of FIG. 5 has the advantage that no auxiliary tools whatsoever are required for mounting the heat distribution covering on the printed circuit board 2, rather it is only necessary to press the plug element 18 into the opening provided therefor in the heat distribution covering 1. The prestress on the heat distribution covering 1, caused by the deformation of the curved plug element head 39 of the plug element 18, improves the heat transfer in particular in the region of the heat-generating components 4, as are shown in FIG. 1. The rest of the construction of the embodiment in accordance with FIG. 5 is analogous to the previous embodiments, and so a description of the assembly is unnecessary.

FIG. 6 shows a cross section through a device for fixing a heat distribution covering 1 on a printed circuit board 2 with a cylindrical pin 19 as fixing element 8 in accordance with a this embodiment, the heat distribution covering 1 is made of an aluminum alloy with particular spring-elastic properties, so that it is possible to form a corresponding spring-elastic edge region with cutting edges 24 of the opening 10.

The assembly of this device in accordance with embodiment 7 has the advantage that the heat distribution covering can be fixed on the printed circuit board 2 with few elements. To that end, firstly the fixing foot 7 with the cylindrical pin 19 is soldered onto the metal layer of the conductor track layer 5 in the region provided therefor. Afterward, the heat distribution covering 1 is pressed by its correspondingly pre-shaped openings 10 onto the pins and, at the same time, is pressed by its area onto the heat-conducting filling material 22—shown in FIG. 1—above the heat-generating components 4 and, when the end position is reached, the cutting edges 24 of the crown-disk type openings 10 are anchored in the material of the cylindrical pin 19.

We claim:

1. A device for fixing a heat distribution covering on a printed circuit board having a placement area carrying a plurality of heat-generating electronic components and at least one topmost conductor track plane for interconnecting contact terminals of the components, the device comprising:
    at least one fixing foot attached on a region of the placement area of the printed circuit board formed with a solder resist layer above at least one conductor track plane extending below said fixing foot, said at least one fixing foot being disposed and fixed on an uncovered metallic area of the topmost conductor track plane correspondingly freed of a solder resist layer, said at least one fixing foot being disposed to be aligned opposite an opening formed in the heat distribution covering; and
    a fixing element disposed on said fixing foot and engaging and holding the heat distribution covering on the printed circuit board.

2. The device according to claim 1, which comprises a solder connection between said fixing foot and the placement area of the printed circuit board.

3. The device according to claim 1, wherein said fixing foot is adhesively bonded to the placement area of the printed circuit board.

4. The device according to claim 1, which comprises a friction welding connection between said fixing foot and the placement area of the printed circuit board.

5. The device according to claim 1, wherein said fixing element is a threaded pin disposed on said fixing foot and extending orthogonally to the placement area.

6. The device according to claim 5, wherein said threaded pin and said fixing foot are formed in one piece.

7. The device according to claim 5, which comprises a fitting nut configured to be screwed onto said threaded pin, said fitting nut accurately fitting into an opening formed into the heat distribution covering.

8. The device according to claim 1, wherein said fixing element is a fixing nut disposed on said fixing foot and formed with a thread axis extending orthogonally to the placement area.

9. The device according to claim 8, wherein said fixing nut and said fixing foot are integrally formed in one piece.

10. The device according to claim 8, which further comprises a covering screw configured to be screwed into said fixing nut, whereby said screw extends through an opening formed in the heat distribution covering and covers the opening.

11. The device according to claim 1, wherein said fixing element is a plug pin formed with an attachment.

12. The device according to claim 11, wherein said fixing foot and said plug pin are formed in one piece.

13. The device according to claim 11, which further comprises a plug element accurately fitted into an opening formed in the heat distribution covering, and said plug element is configured to be brought into engagement with said attachment of said plug pin.

14. The device according to claim 1, wherein said fixing element is a cylindrical pin.

15. The device according to claim 14, wherein said cylindrical pin and said fixing foot are integrally formed in one piece.

16. The device according to claim 14, wherein said cylindrical pin projects through an opening formed in the heat distribution covering and a crown disk is disposed on said cylindrical pin.

17. The device according to claim 14, wherein the heat distribution covering is formed with an opening shaped as a crown disk in an edge region thereof and having cutting areas to be brought into engagement with said cylindrical pin.

18. The device according to claim 1, wherein said fixing element is configured to project through an opening formed in the heat distribution covering and said fixing element is flanged on the heat distribution covering.

19. The device according to claim 1, wherein said fixing element is a hollow rivet with said fixing foot to be soldered onto the printed circuit board.

20. A printed circuit board assembly, comprising:
    a printed circuit board formed with a solder resist layer having a placement area carrying a plurality of heat-generating electronic components having respective connection terminals;
    at least one topmost conductor track plane interconnecting said connection terminals of said electronic components said topmost conductor track plane covered by said solder resist layer;
    a device for fixing a heat distribution covering on said printed circuit board, said device including:
        at least one fixing foot attached on a region of said placement area above at least one conductor track plane extending below said fixing foot, said at least one fixing foot being disposed and fixed on an uncovered metallic area of the topmost conductor track plane correspondingly freed of a solder resist layer, said at least one fixing foot being disposed to be aligned opposite an opening formed in the heat distribution covering; and
        a fixing element disposed on said fixing foot and engaging and holding the heat distribution covering on the printed circuit board.

21. The assembly according to claim 20, wherein said electrical components are mounted on said printed circuit board with a process selected from the group consisting of flip-chip technology, CSP technology, and LFBGA technology.

22. The assembly according to claim 20, wherein said printed circuit board is a multilayer printed circuit board.

23. A printed circuit board assembly, comprising:

a printed circuit board having a placement area carrying a plurality of heat-generating electronic components having respective connection terminals;

a first conductor track plane interconnecting said connection terminals of said electronic components, and a second conductor track plane below said first conductor track plane;

a heat distribution covering disposed over said plurality of heat-generating electronic components;

at least one device for fixing said heat distribution covering on said printed circuit board, said device including a fixing foot attached on a region of said placement area above said second conductor track plane, said fixing foot being disposed and fixed on an uncovered metallic area of said first conductor track plane which is otherwise covered by a solder resist layer, said at least one fixing foot being disposed to be aligned opposite an opening formed in the heat distribution covering; and a fixing element disposed on said fixing foot and engaging and holding said heat distribution covering on said printed circuit board.

24. The assembly according to claim 23, wherein said electrical components are mounted on said printed circuit board with a process selected from the group consisting of flip-chip technology, CSP technology, and LFBGA technology.

25. The assembly according to claim 23, wherein said printed circuit board is formed with a soldering resist layer.

26. The assembly according to claim 23, which comprises heat-conducting filling material disposed between an individual said electronic component and said heat distribution covering.

27. The assembly according to claim 23, which further comprises a solder connection between said fixing foot and the placement area of the printed circuit board.

28. The assembly according to claim 23, wherein said fixing foot is adhesively bonded to the placement area of the printed circuit board.

29. The assembly according to claim 23, which further comprises a friction welding connection between said fixing foot and the placement area of the printed circuit board.

30. The assembly according to claim 23, wherein said printed circuit board is a multilayer printed circuit board.

31. The assembly according to claim 23, wherein said fixing element is a threaded pin disposed on said fixing foot and extending orthogonally to the placement area.

32. The assembly according to claim 31, wherein said threaded pin and said fixing foot are formed in one piece.

33. The assembly according to claim 31, which further comprises a fitting nut configured to be screwed onto said threaded pin, said fitting nut accurately fitting into an opening formed into the heat distribution covering.

34. The assembly according to claim 23, wherein said fixing element is a fixing nut disposed on said fixing foot and formed with a thread axis extending orthogonally to the placement area.

35. The assembly according to claim 33, wherein said fixing nut and said fixing foot are integrally formed in one piece.

36. The assembly according to claim 33, which further comprises a covering screw configured to be screwed into said fixing nut, said screw extending through an opening formed in the heat distribution covering and covering the opening.

37. The assembly according to claim 23, wherein said fixing element is a plug pin formed with an attachment.

38. The assembly according to claim 37, wherein said fixing foot and said plug pin are formed in one piece.

39. The assembly according to claim 37, which further comprises a plug element accurately fitted into an opening formed in the heat distribution covering, and said plug element being configured to be brought into engagement with said attachment of said plug pin.

40. The assembly according to claim 23, wherein said fixing element is a cylindrical pin.

41. The assembly according to claim 40, wherein said cylindrical pin and said fixing foot are integrally formed in one piece.

42. The assembly according to claim 40, wherein said cylindrical pin projects through an opening formed in the heat distribution covering and a crown disk is disposed on said cylindrical pin.

43. The assembly according to claim 40, wherein the heat distribution covering is formed with an opening shaped as a crown disk in an edge region thereof and having cutting areas to be brought into engagement with said cylindrical pin.

44. The assembly according to claim 23, wherein said fixing element is configured to project through an opening formed in the heat distribution covering and said fixing element is flanged on the heat distribution covering.

45. The assembly according to claim 23, wherein said fixing element is a hollow rivet with said fixing foot to be soldered onto the printed circuit board.

46. The assembly according to claim 23, wherein said printed circuit board is formed with a solder resist layer and said fixing foot is disposed on an uncovered metallic area of said conductor plane correspondingly freed of a solder resist layer.

* * * * *

UNITED STATES PATENT AND TRADEMARK OFFICE
CERTIFICATE OF CORRECTION

PATENT NO. : 6,757,171 B2
DATED : June 29, 2004
INVENTOR(S) : Monika Bauer et al.

It is certified that error appears in the above-identified patent and that said Letters Patent is hereby corrected as shown below:

Column 8,
Lines 29-60, should read as follows:

FIG. 5 Shows a cross-section through a device for fixing a heat distribution covering 1 on a printed circuit board 2 with a plug pin 16 having an attachment in accordance with a fifth embodiment of the invention. The plug pin 16 of the fifth embodiment is arranged as fixing element 18 on the fixing foot 7 and is formed in one piece with the latter. The free end of the plug pin 16 is of frustoconical configuration, so that a plug element 18 with resilient snap-action hooks 37, 38 can be pushed over the plug pin 16 and the attachment. The plug element 18 has a plug element head 39 which is slightly curved and is deformed resiliently whilst maintaining a prestress and is arranged with an accurate fit in the opening in the heat distribution covering 1. This embodiment of Fig. 5 has the advantage that no auxiliary tools whatsoever are required for mounting the heat distribution covering on the printed circuit board 2, rather it is only necessary to press the plug element 18 into the opening provided therefor in the heat distribution covering 1. The prestress on the heat distribution covering 1, caused by the deformation of the curved plug element head 39 of the plug element 18, improves the heat transfer in particular in the region of the heat-generating components 4, as are shown in Fig. 1. The rest of the construction of the embodiment in accordance with Fig. 5 is analogous to the previous embodiments, and so a description of the assembly is unnecessary.

FIG. 6 shows a cross section through a device for fixing a heat distribution covering 1 on a printed circuit board 2 with a cylindrical pin 19 as fixing element 8 in accordance with a sixth embodiment of the invention. The cylindrical pin 19 is formed in one piece with the fixing foot 7 and projects perpendicularly relative to the placement area 3 of the printed circuit board 2 through the opening 10 in the heat distribution covering 1. A crown disk 20 is anchored with its cutting edges in the material of the cylindrical pin 19. As a result, the heat distribution covering 1 is simultaneously held in position and prestressed on the printed circuit board 2. Since the rest of the construction of the sixth embodiment of the invention corresponds to the preceding embodiments 1 to 5, a more extensive description is omitted.

FIG. 7 shows a cross section through a device for fixing a heat distribution covering 1 on a printed circuit board 2 with an opening 10 shaped to form a crown disk in the heat distribution covering in accordance with a seventh embodiment of the invention. In a manner similar to that of FIG. 6, a cylindrical pin 19 projects from the fixing foot 7 orthogonally to the placement area 3 of the printed circuit board 2 through an opening 10 in the heat distribution covering. This opening 10 is equipped with cutting edges 24 in the edge region, which cutting edges have been produced by stamping pressing for example, and said cutting edges 24 anchor heat distribution covering in the region of the opening 10 in the pin material of the cylindrical pin 19. In this embodiment, the heat distribution covering 1 is made of an aluminum alloy with particular spring-elastic properties, so that it is possible to form a corresponding spring-elastic edge region with cutting edges 24 of the opening 10.

UNITED STATES PATENT AND TRADEMARK OFFICE
CERTIFICATE OF CORRECTION

PATENT NO.    : 6,757,171 B2
DATED         : June 29, 2004
INVENTOR(S)   : Monika Bauer et al.

It is certified that error appears in the above-identified patent and that said Letters Patent is hereby corrected as shown below:

<u>Column 8, Cont'd,</u>
The assembly of this device in accordance with embodiment 7 has the advantage that the heat distribution covering can be fixed on the printed circuit board 2 with few elements. To that end, firstly the fixing foot 7 with the cylindrical pin 19 is soldered onto the metal layer of the conductor track layer 5 in the region provided therefor. Afterward, the heat distribution covering 1 is pressed by its correspondingly pre-shaped openings 10 onto the pins and, at the same time, is pressed by its area onto the heat-conducting filling material 22 - shown in Fig. 1 - above the heat-generating components 4 and, when the end position is reached, the cutting edges 24 of the crown-disk type openings 10 are anchored in the material of the cylindrical pin 19.

<u>Column 9,</u>
Lines 12-19, should be deleted.

Signed and Sealed this

Thirtieth Day of November, 2004

JON W. DUDAS
*Director of the United States Patent and Trademark Office*